United States Patent [19]

Kuniyoshi et al.

[11] 4,398,193

[45] Aug. 9, 1983

[54] CONTROL APPARATUS

[75] Inventors: Yasunobu Kuniyoshi, Tokyo; Takashi Okada, Yokohama, both of Japan

[73] Assignee: Sony Corporation, Tokyo, Japan

[21] Appl. No.: 233,987

[22] Filed: Feb. 12, 1981

[30] Foreign Application Priority Data

Feb. 14, 1980 [JP] Japan .................................. 55-17056
Feb. 14, 1980 [JP] Japan .................................. 55-17057

[51] Int. Cl.$^3$ .......................... H04Q 9/00; H04B 9/00
[52] U.S. Cl. ............................ 340/825.76; 358/194.1; 455/186; 340/825.68
[58] Field of Search ........... 340/168 S, 168 B, 825.76; 358/194.1, 191.1; 455/186

[56] References Cited

U.S. PATENT DOCUMENTS 4,045,777 8/1977 Mierzwinski et al. .......... 340/168 B
4,318,130 2/1982 Heuer ............................. 358/191.1

FOREIGN PATENT DOCUMENTS 2423716 12/1974 Fed. Rep. of Germany ... 358/194.1

OTHER PUBLICATIONS

"New Digital Remote Control", M. Wilson, Radio-Electronics, vol. 47, No. 1, pp. 58-60, 86-87, Jan. 1976.

Primary Examiner—Donald J. Yusko
Attorney, Agent, or Firm—Lewis H. Eslinger; Alvin Sinderbrand

[57] ABSTRACT

A control apparatus for controlling a plurality of characteristics, such as hue, color, brightness, sound and the like, of a reproduced video picture includes a transmitter having a memory for storing data entries corresponding to the characteristics to be controlled, a central processing unit to change selected ones of the stored data entries and a plurality of switches for controlling the central processing unit to change selected ones of the stored data entries in response to actuation of selected ones of the switches, whereby the transmitter transmits the stored data entries, as changed; a receiver including a shift register in which the transmitted control data entries are serially received and converted into parallel control data entries, a D-A converter for producing a plurality of analog control voltages in response to the parallel control data entries from the shift register; and a plurality of voltage-controlled circuits for controlling the plurality of characteristics in response to the plurality of analog control voltages.

8 Claims, 16 Drawing Figures

| SWITCH | USER (Sm: ON) | MAKER (Sm: OFF) |
|---|---|---|
| $S_0$ | SOUND VOL : UP | (AUXILIARY) : UP |
| $S_1$ | SOUND VOL : DOWN | (AUXILIARY) : DOWN |
| $S_2$ | HUE : UP | STANDARD HUE : UP |
| $S_3$ | HUE : DOWN | STANDARD HUE : DOWN |
| $S_4$ | COLOR : UP | ACC : UP |
| $S_5$ | COLOR : DOWN | ACC : DOWN |
| $S_6$ | PICTURE : UP | STANDARD CONTRAST : UP |
| $S_7$ | PICTURE : DOWN | STANDARD CONTRAST : DOWN |
| $S_8$ | TONE : UP | BLANK |
| $S_9$ | TONE : DOWN | BLANK |
| $S_{10}$ | BRIGHTNESS : UP | STANDARD BRIGHTNESS : UP |
| $S_{11}$ | BRIGHTNESS : DOWN | STANDARD BRIGHTNESS : DOWN |
| $S_{12}$ | SHARPNESS : UP | AGC : UP |
| $S_{13}$ | SHARPNESS : DOWN | AGC : DOWN |
| $S_{14}$ | STANDARD STATE | STANDARD STATE |
| $S_{15}$ | MUTING | BLANK |

FIG. 7

| ORDER | CONTROL OBJECT | BITS |
|---|---|---|
| 1 | SOUND VOLUME | 5 |
| 2 | HUE | 5 |
| 3 | COLOR | 5 |
| 4 | PICTURE | 5 |
| 5 | TONE | 3 |
| 6 | BRIGHTNESS | 4 |
| 7 | SHARPNESS | 4 |
| 8 | AUXILIARY | 4 |
| 9 | STANDARD BRIGHTNESS | 4 |
| 10 | STANDARD HUE | 4 |
| 11 | STANDARD CONTRAST | 4 |
| 12 | AGC | 5 |
| 13 | ACC | 5 |
| TOTAL | | 57 |

CONTROL APPARATUS

BACKGROUND OF THE INVENTION

1. Field of the Invention

The present invention relates generally to a control apparatus and, more particularly, is directed to a novel control apparatus for controlling a plurality of characteristics in a color television receiver.

2. Description of the Prior Art

In a color television receiver, controls or adjustments of the user's choice are normally related to sound volume, tone, hue, color, picture (contrast and color), brightness, sharpness, and the like. Further, a manufacturer usually adjusts, upon shipment of the color television receiver from the factory, the brightness whereby a brightness knob is set to its standard position, the hue with a hue knob being set to its standard position, the contrast with a contrast knob being set to its standard position, the AGC (automatic gain control), the ACC (automatic chrominance control), and the like.

These adjustments are normally effected by means of variable resistors. Therefore, when the television receiver is constructed in the form of an IC (integrated circuit), these variable resistors must be attached to the outside of the IC so that the effect and advantages of IC construction are greatly reduced.

Further, the variable resistor is a movable component so that its reliability is low and its cost is high. The variable resistor is also relatively large in size so that the designing tolerance of a television receiver is small. The adjustment of the variable resistor by remote control operation is also difficult.

In addition, when a television receiver is adjusted at the factory, this adjustment is only made at the rear of the receiver. Therefore, it is difficult for a technician at the factory to adjust the receiver while looking at the picture screen.

SUMMARY OF THE INVENTION

Accordingly, it is an object of this invention to provide a control apparatus that avoids the above-described difficulties encountered with the prior art.

It is another object of this invention to provide a control apparatus suitable for controlling a plurality of functions.

It is a further object of this invention to provide a control apparatus which is particularly suitable for IC construction.

It is still another object of this invention to provide a control apparatus which can preset a circuit to be controlled to a previous determined condition.

In accordance with an aspect of this invention, a control apparatus for controlling a plurality of functions includes first storage means for storing a plurality of control data entries; a plurality of control switch means; control data changing means for changing each control data entry in said first storage means in response to the status of the plurality of control switch means; control data transmitting means for serially transmitting control signals corresponding to said plurality of control data entries in the first storage means; second storage means; control data receiving means for receiving the serially-transmitted control signals and storing the received control signals in the second storage means; a plurality of digital-to-analog converting means for generating a plurality of analog control voltages corresponding to the plurality of control data entries in response to the control signals stored in the second storage means; and a plurality of voltage-controlled means for controlling the plurality of functions in response to the plurality of analog control voltages from the plurality of digital-to-analog converting means, respectively.

The above and other objects, features and advantages of this invention will be apparent from the following detailed description of the invention taken in conjunction with the accompanying drawings.

DETAILED DESCRIPTION OF THE PREFERRED EMBODIMENTS

Figure 1:
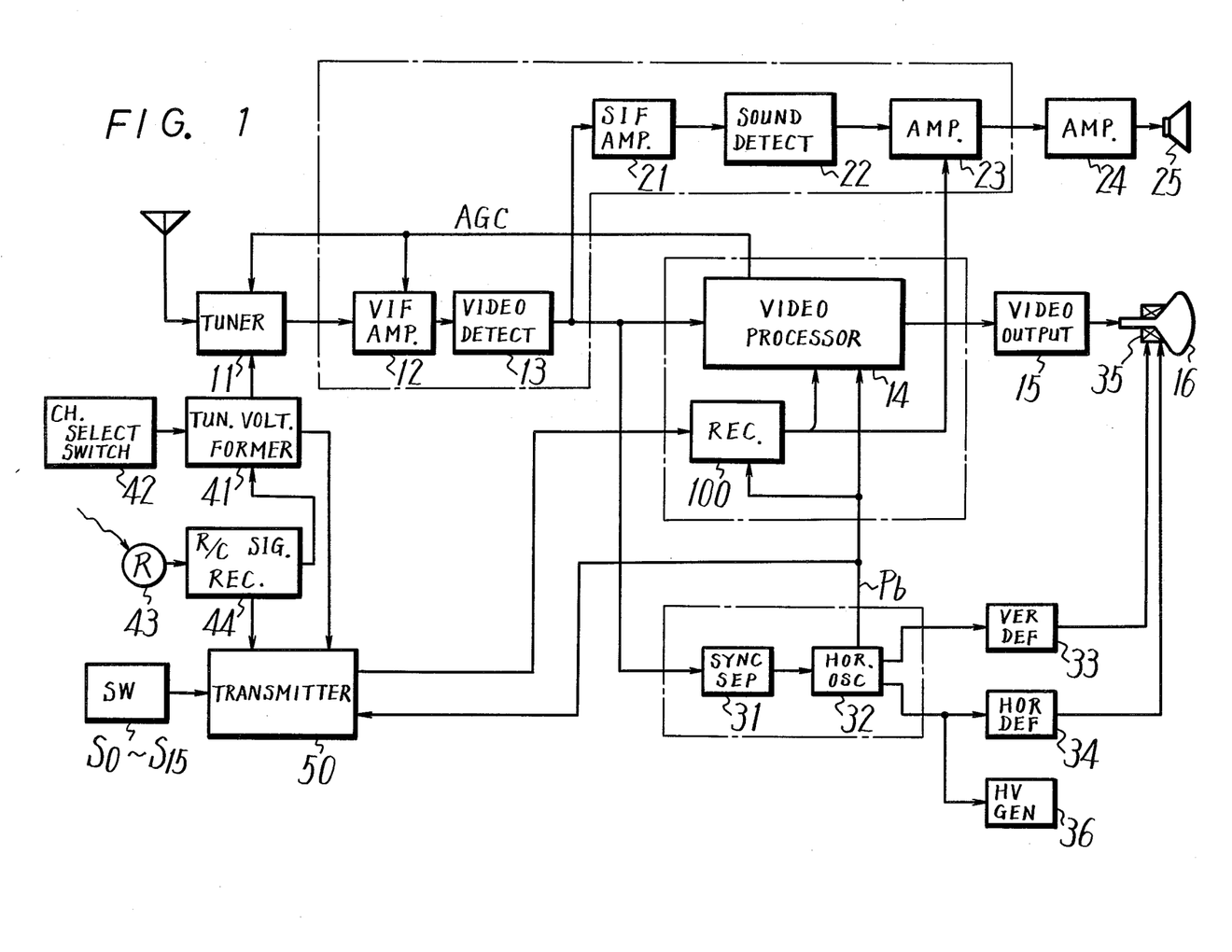
FIG. 1 is a block diagram of a control circuit according to one embodiment of this invention.

Referring to the drawings in detail, and initially to FIG. 1 thereof, a control circuit for a color television receiver includes a tuner 11 of the electronic tuning type, in which, for example, a variable capacitance diode is provided as a tuning element and a tuning voltage is applied to the tuner 11 to make it possible to receive a given VHF or UHF channel.

A tuning voltage forming circuit 41 is provided, which is fed with numeral information corresponding to a desired channel, through a channel select switch 42 so as to form a tuning voltage corresponding to the desired channel. This tuning voltage is supplied to tuner 11 which selects the above desired channel in response thereto. The tuning voltage forming circuit 41 also functions to store therein information corresponding to the channel which was last received when the power supply was turned OFF, and to supply the tuning voltage for the above stored channel to tuner 11 when the power supply is turned ON.

The circuit also includes a remote control signal receiving element 43 or, for example, an infrared ray receiving element in the case of infrared type remote control, and a remote control signal receiving circuit 44 which decodes a remote control signal supplied from receiving element 43 to produce a signal for channel selection which, in turn, is fed to tuning voltage forming circuit 41 to form the tuning voltage.

An intermediate frequency signal from tuner 11 is supplied through a VIF (video intermediate frequency) amplifier 12 to a video detecting circuit 13 in which a color video signal and an SIF (sound intermediate frequency) signal of the intermediate frequency signal are demodulated. The color video signal is fed to a video processing circuit 14 to be separated into a luminance signal and a chrominance signal, the latter signal being used to demodulate color difference signals, which are then mixed with the luminance signal to produce three primary color signals. These primary color signals are then supplied through a video output circuit 15 to a color picture tube 16 to reproduce a color picture.

The SIF signal from video detecting circuit 13 is supplied through an SIF amplifier 21 to a sound detecting circuit 22 to demodulate a sound or audio signal, which is then supplied through a preamplifier 23 and a main amplifier 24 to a speaker 25.

The video signal from the video detecting circuit 13 is also supplied to a sync (synchronizing) separating circuit 31 to separate horizontal and vertical sync pulses therefrom. These horizontal and vertical sync pulses are then fed to a horizontal and vertical oscillating circuit 32 to form horizontal and vertical oscillating signals, which are respectively fed through a horizontal deflecting circuit 34 and a vertical deflecting circuit 33 to a deflecting coil 35. The horizontal oscillating signal is also supplied to a high-voltage generating circuit 36.

If it is desired to control the sound volume, an electronic level control circuit is provided on the sound signal line of preamplifier 23, and an analog control voltage is applied to this level control circuit to change the level of the sound signal for adjusting the sound volume. In a similar manner, preamplifier 23 and video processing circuit 14 are provided with electronic level control circuits corresponding to respective control characteristics (other than the above-described sound volume) to adjust such control characteristics by analog control voltages.

In the above-described embodiment, each circuit which is surrounded by a dot-chain line is formed as an IC (integrated circuit).

A transmitter 50 is provided for transmitting the data of the control characteristics to be adjusted at the beginning of the switching operation, and a receiver 100 is also provided which is fed with the above data to form an analog control voltage for an adjustment operation.

Figure 2:
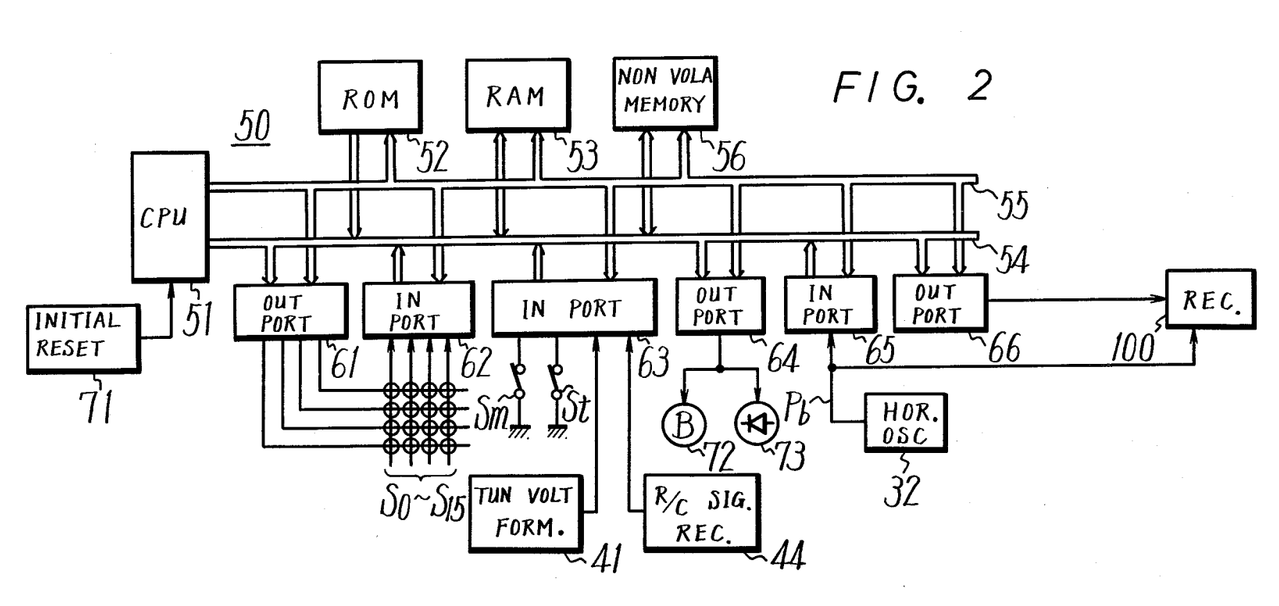
FIG. 2 is a block diagram of one embodiment of a transmitter that can be used in the circuit of FIG. 1.
Figure 4:
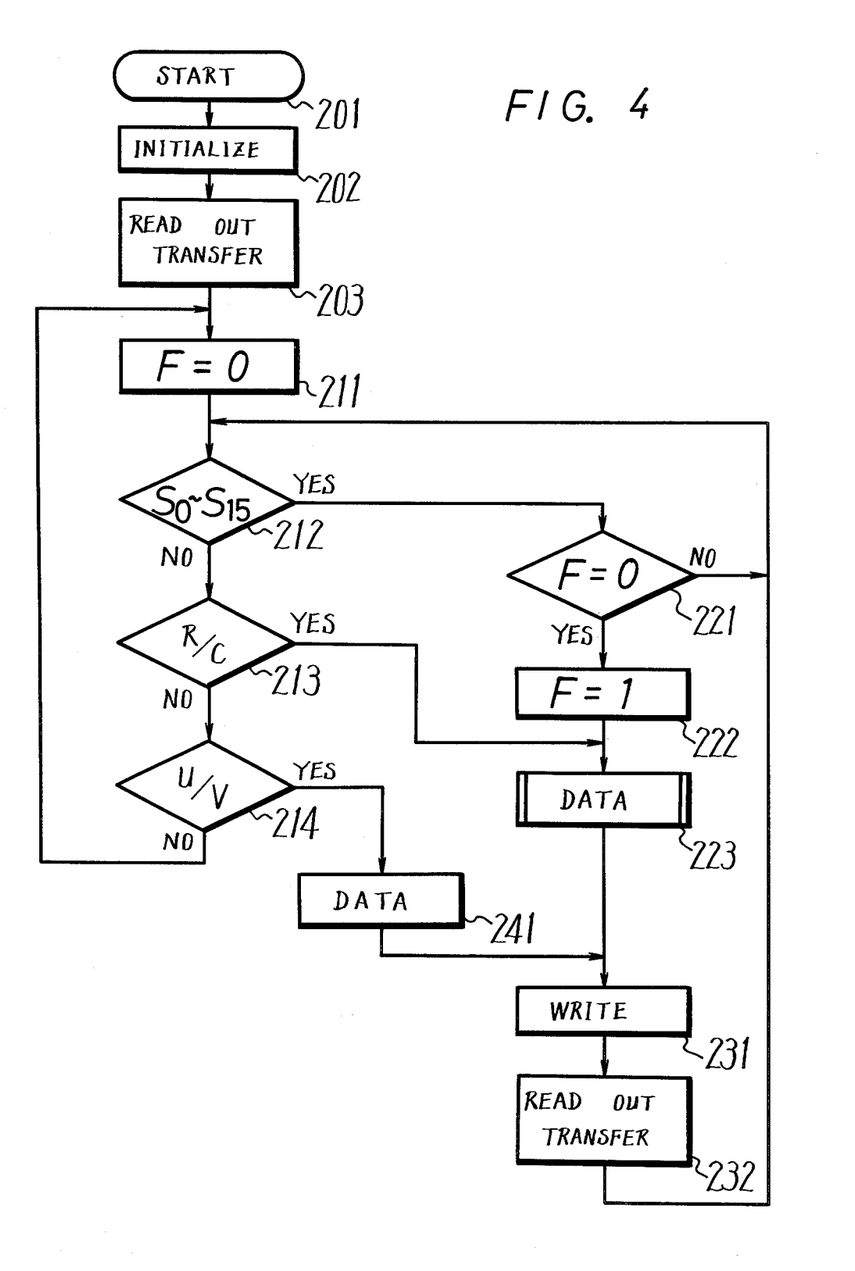
FIGS. 4 and 5 are flow charts used for explaining the operation of the control circuit according to this invention.

In this embodiment, transmitter 50 uses a micro-computer, as shown in FIG. 2, in which there are provided, for example, 4-bit CPU (Central processing unit) 51, a ROM (read-only memory) 52 which has a flow chart program as shown in FIG. 4 written therein, a RAM (random access memory) 53 for providing a work area, a data bus 54 and an address bus 55, respectively. In addition, there are provided a non-volatile memory 56 for storing the data of the aforementioned control characteristics, 4-bit parallel input ports 62, 63, and 65, each having a latch function, 4-bit parallel output ports 61 and 64, each having a latch function, and a serial output port 66.

If the micro-computer is of the so-called one-chip type, circuits 51 to 55 and 61 to 66 are formed as a one-chip integrated circuit.

In FIG. 2, reference characters $S_0$ through $S_{15}$ represent switches for performing the adjustment of the aforesaid control characteristics, and $S_m$ represents a mode switch. With switches $S_0$–$S_{15}$ being connected in a matrix arrangement, they are fed with pulses for a key scan through output port 61 from CPU 51, while the outputs of the switches are returned to CPU 51 through input port 62. The mode switch $S_m$ is changed over to the user's adjusting mode or to the manufacturer's adjusting mode so that switches $S_0$ to $S_{15}$ are each changed to an adjusting content which is dependent on the chosen mode, as shown, for example, in FIG. 6. For example, switch $S_{14}$, upon being operated, is used for setting the color, hue, brightness and picture to a standard condition, and switch $S_{15}$ is used for operating the sound muting control in an ON or OFF state during each operation thereof.

A test switch $S_t$ is provided which, when turned ON (normal mode), and during operation of any of switches $S_0$ to $S_{15}$, varies the value for the corresponding control characteristic by one step. On the other hand, when switch $S_t$ is turned OFF (quick mode), during operation of any of switches $S_0$ to $S_{15}$, the value for the corresponding control characteristic becomes maximum or minimum.

An initial reset circuit 71 for initially resetting CPU 51 upon switching ON a power supply, a buzzer 72 for generating a beep signal upon the operation of a switch, and an LED (light emitting diode) 73 are also provided in the circuit of FIG. 2.

In order to change over the AGC for the VHF receiving mode and for the UHF receiving mode, the tuning voltage forming circuit 41 produces a band indicating signal which is at logic level "0" for the VHF receiving mode and at logic level "1" for the UHF receiving mode, and which is supplied to input port 63. Also, the remote control signal receiving circuit 44 produces a signal for providing instructions for the adjustment of the above control characteristic and this signal is supplied to input port 63. In this embodiment, the instructing signal has the same format as the output of switches $S_0$ to $S_{15}$ and can be obtained only once during each operation of the transmitting unit of a remote control device.

Figure 3A:
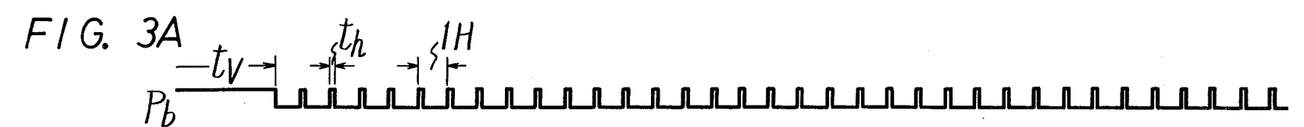
FIGS. 3A to 3C are waveform diagrams used for explaining the pulse and data forms used in this invention.

The oscillating circuit 32 produces a blanking pulse $P_b$ which is at logic level "1" during each horizontal blanking period $t_h$ and each vertical blanking period $t_v$, as shown in FIG. 3A, and which is fed to input port 65. When data is transferred from transmitter 50 to receiver 100, the blanking pulse $P_b$ is used as the clock pulse therefor and is fed to receiver 100. As shown in FIG. 1, pulse $P_b$ is also fed to video processing circuit 14 for producing a burst flag.

Figure 3B:
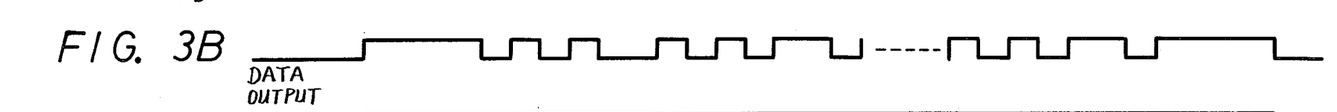
Figure 3C:
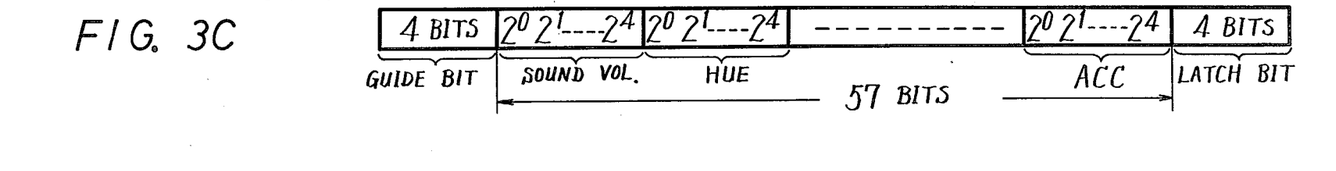
Figure 7:
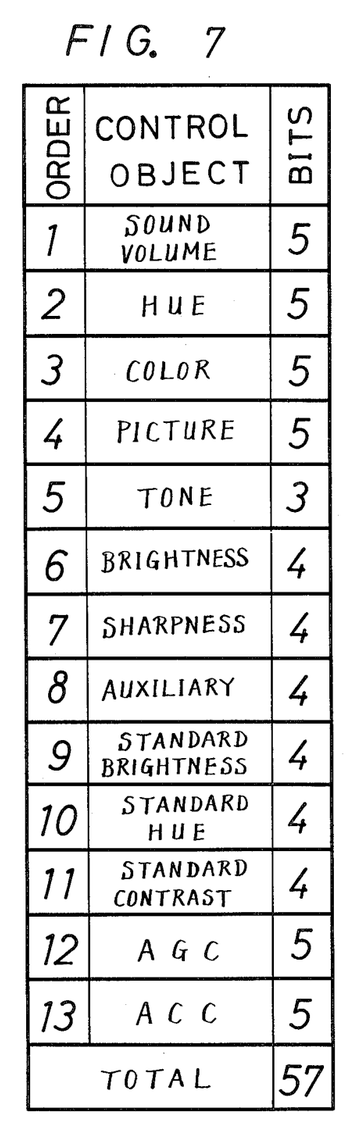

Data is delivered directly to receiver 100 through output port 66, and the format of the transmitting data is as shown, for example, in FIG. 3C and the contents of the control characteristics included therein are shown in FIG. 7. In other words, data for all of the control characteristics are combined in one set, as shown in FIG. 3C, and this set of data is delivered from output port 66 to receiver 100. In the set of data, the order of data of the respective control characteristics and the number of bits included in each data portion are selected as shown in FIG. 7. Further, as shown in FIG. 3C, each set of data has a guide pulse or bit consisting of 4 bits preceeding it and having a logic level "1" value, and has a latch pulse or bit consisting of 4 bits added at its end and having a logic level "1" value. In this case, the data is delivered from its LSB (least significant bit) in sequence.

The timing in transmitting the data from outport port 66 to receiver 100 is selected as shown in FIGS. 3A and 3B. In other words, following the end of the first vertical blanking period $t_v$ after CPU 51 has completed its preparation of data delivery, the data is delivered, starting from the guide pulse which is in synchronism with the horizontal blanking pulse.

In operating switches $S_0$ to $S_{15}$ or the remote control, CPU 51 changes only the data for a control characteristic in accordance with the program stored in ROM 52 and then the data for all of the characteristics are transmitted to receiver 100.

The arrangement and operation of steps of a program written in ROM 52 are shown, for example, in FIG. 4, as follows:

[201] Upon switching ON the power supply, the initial reset circuit 71 functions to reset the computer or transmitter 50.

The program starts from this step.

[202] The ports 61 to 66 and the like are initialized or preset.

[203] The data for all of the control characteristics are read out from no-volatile 56 and transferred from output port 66 to receiver 100 with the format and timing of FIG. 3. This transfer of data is carried out several times in consideration of possible instability upon the switching ON of the power supply.

Thus, according to the above steps [201] to [203], the television receiver has its sound volume and the like set at a time when the power supply is turned ON, and maintains this set condition until the next data is transferred.

[211] When any of switches $S_0$ to $S_{15}$ is operated, even though this switch is continuously pressed, transmission of data occurs only once. This step functions to set a flag for effecting such transmission. In this manner, a flag signal F is set at logic level "0," that is, F="0," whereby transfer of data is allowed.

[212] In this step, a determination is made as to whether or not any of switches $S_0$ to $S_{15}$ are operated. When the determination is positive or at a "yes" condition, the operation jumps to step [221], but when it is negative or at a "no" condition, the operation is advanced to step [213].

[213] In this step, a determination is made as to whether or not a remote control output signal has been produced by receiving circuit 44. If the determination is positive or at a "yes" condition, the operation jumps to [223], and if negative or at a "no" condition, the operation is advanced to [214].

[214] In this step, a determination is made as to whether or not the signal band has been changed over between VHF and UHF by the band indicating signal fed from tuning voltage forming circuit 41. If the determination is positive or at a "yes" condition, the operation jumps to step [241], and if negative or at a "no" condition, the operation is returned to step [211].

Accordingly, when no operation is carried out in the television receiver, CPU 51 repeatedly performs the operation of steps [211] to [214], so that new data will not be transferred to receiver 100 and the sound volume and other characteristics will be maintained at their previous states.

[221] This is a step for judging the advisability of transferring the data according to the value of flag signal F. If F≠"0," the operation jumps to step [212], and if F="0," the operation is advanced to step [222].

[222] The flag signal F is set to logic level "1".

[223] Basically, although this step will be described later in greater detail, data for one control characteristic corresponding to switches $S_0$ to $S_{15}$, $S_m$ and $S_t$ is generated.

[231] The generated data from step [223] is written in memory 56 at its corresponding address.

[232] The data for all control characteristics is read out from memory 56 and transferred through output port 66 to receiver 100 with the format and timing described in FIG. 3.

[241] This is a step for performing the process when the signal band has been detected as being changed over in step [214], and AGC data for a new receiving band is generated in this step.

Figure 5:
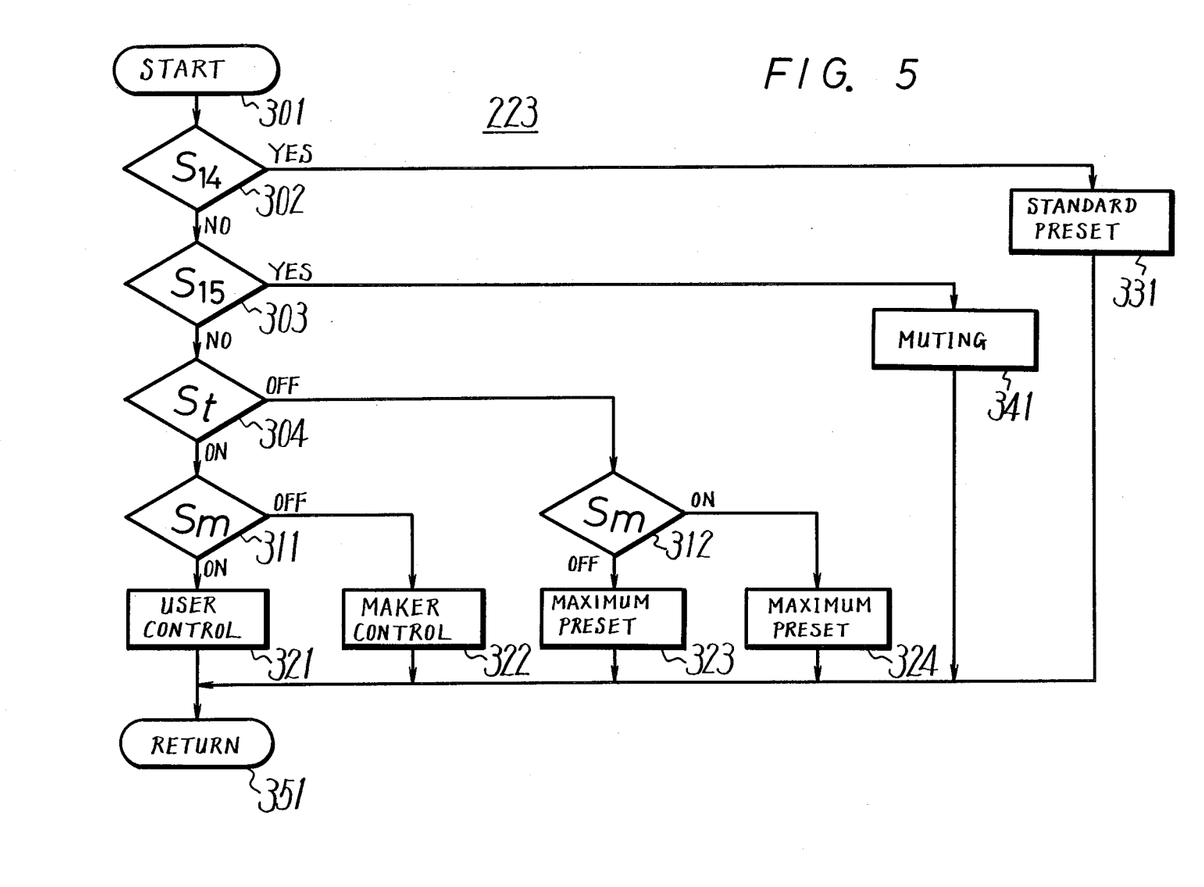

Referring now to FIG. 5, step [223] is arranged to have the routine as shown therein in greater detail.

[301] The routine starts from this step.

[302] A determination is made as to whether or not an operated switch is switch $S_{14}$. If the determination is positive or at a "yes" condition, the operation jumps to step [331], and if negative or at a "no" condition, the operation is advanced to step [303].

[303] A determination is made as to whether or not an operated switch is switch $S_{15}$. If the determination is positive or at a "yes" condition, the operation jumps to step [341], and if negative or at a "no" condition, the operation is advanced to step [304].

[304] A determination is made as to whether switch $S_t$ is ON (normal mode) or OFF (quick mode). If it is ON, the operation is advanced to step [311], and if it is OFF, the operation is advanced to step [312].

[311] A determination is made as to whether switch $S_m$ is ON (user mode) or OFF (manufacturer's mode). If it is ON, the operation is advanced to step [321], and if it is OFF, the operation is advanced to step [322].

[312] A determination is made as to whether switch $S_m$ is ON or OFF. If it is ON, the operation is advanced to step [323], and if it is OFF, the operation is advanced to step [324].

Figure 6:
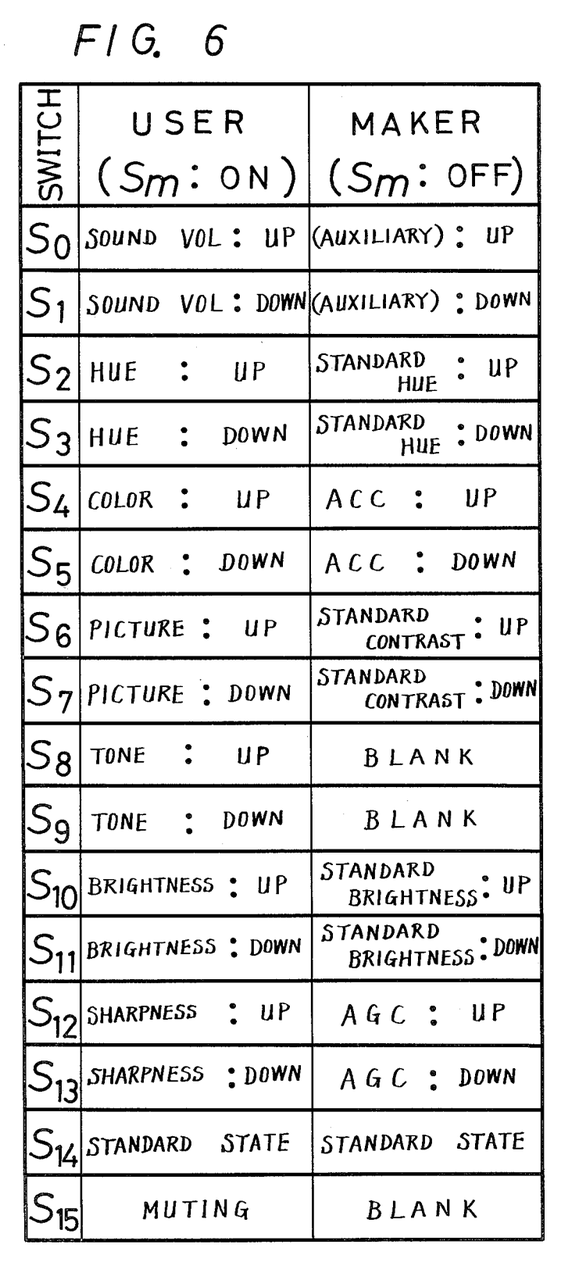
FIGS. 6 and 7 are charts showing the characteristics to be controlled by this invention.

[321] This step is a user control step which is exercised when a user conducts an adjustment operation by means of switches $S_0$ to $S_{13}$, as shown in FIG. 6, at the middle column thereof, or when a user adjusts a television in an ordinary manner. Therefore, when any of switches $S_0$ to $S_{13}$ is operated, data for the control characteristic corresponding to the operated switch is changed so as to adjust the above control characteristic up or down by one step.

[322] This step is a manufacturer control step which is exercised when a manufacturer or a serviceman conducts an adjustment operation with any of switches $S_0$ to $S_7$ and $S_{10}$ to $S_{13}$, as shown in FIG. 6 in the right-hand column thereof. When any of these switches is operated, data for the control characteristic corresponding to the operated switch is changed so as to adjust the above control characteristic up or down by one step.

[323] This is a step which is exercised when a manufacturer or a serviceman conducts an adjustment operation with any of switches $S_0$ to $S_{13}$, as shown in the middle column of FIG. 6, in a quick mode. Accordingly, this step generates data such that when any of switches $S_0$ to $S_{13}$ is operated, the control characteristic corresponding to the operated switch is preset at a maximum or minimum.

[324] This step is essentially the same as step [323], that is, this step is exercised when the adjustment of any of switches $S_0$ to $S_7$ and $S_{10}$ to $S_{13}$ shown in the right column of FIG. 6 is carried out in a quick mode. Accordingly, this step generates data such that the control characteristic corresponding to the operated switch is preset at a maximum or minimum.

[331] This step generates data including hue, color, picture and brightness which are preset to respective standard values.

[341] This step is exercised when the sound muting operation is turned ON and OFF. Whenever switch $S_{15}$ is operated, data for the sound volume having a preset level and data for the sound volume having a zero level are alternately produced in this step.

[351] This step indicates that routine or step [223] is finished.

Figure 8:
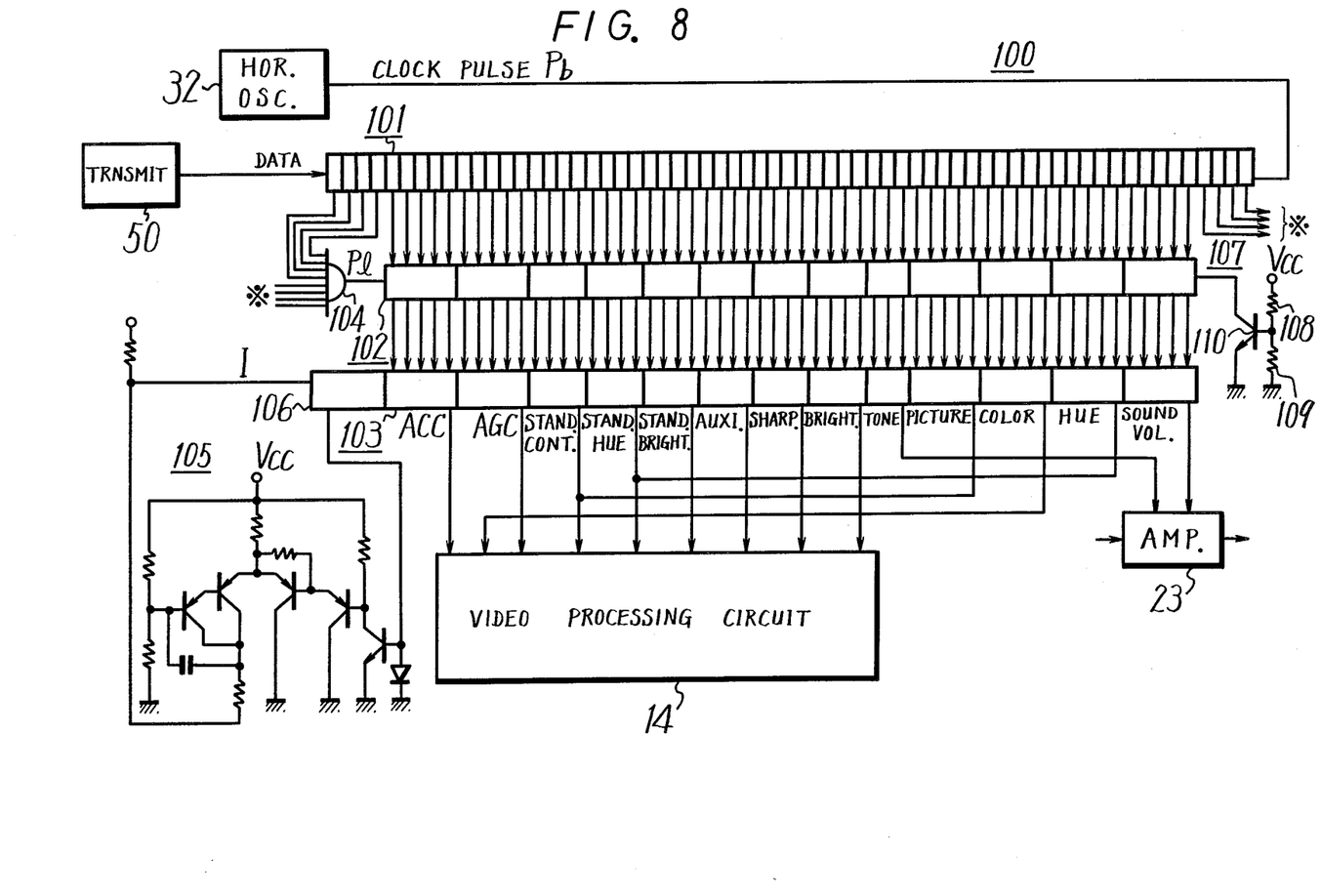
FIG. 8 is a circuit-wiring, block diagram of one embodiment of a receiver than can be used in the circuit of FIG. 1.

Referring now to FIG. 8, there is shown a preferred construction of receiver 100. As shown therein, receiver 100 is formed with a 65-stage shift register 101, a latch circuit 102 for latching data having 57 bits from shift register 101 but not the bits of the first four stages and those of the last four stages thereof, and a D-A (digital-to-analog) converter 103 for converting the output of latch circuit 102 into an analog voltage for each control characteristic.

The first 4-stage information data and last 4-stage information data of shift register 101 are fed to an AND gate 104 to derive therefrom a latch pulse $P_l$ when all of such information data is at logic level "1". This latch pulse $P_l$ is applied to latch circuit 102 so that the data having 57 bits stored in shift register 101 at that time, with the exception of the first 4-stage and last 4-stage bits, are latched into latch circuit 102.

The shift register 101 is fed with serial data from transmitter 50 during transmission of each net (65 bits) of data and also with the blanking pulse $P_b$ from oscillating circuit 32 as a clock pulse therefor.

In this case, since the input data is delivered in sequence starting from the guide bit which is in synchronism with the horizontal blanking pulse after the completion of the vertical blanking period $t_v$, the data is serially transferred to shift register 101 by the blanking pulse $P_b$ starting from the guide bit and proceeding in order.

After the supply of one set of data from transmitter 50 has been completed, shift register 101 of receiver 100 is filled with one set of 65-bit data, with the first four stages and last four stages of shift register 101 having stored therein the latch bits and guide bits, respectively. Accordingly, when latch pulse $P_l$ is produced at the output of AND gate 104, the data having 57 bits is latched into latch circuit 102.

Thus, the data latched into latch circuit 102 is successively arranged for all of the control characteristics from LSB in the order shown in FIG. 7 so as to form serial data. This data is converted into an analog voltage for each control characteristic by D-A converter 103. In other words, a control voltage for each control characteristic is obtained. Then, the control voltage for the sound volume and that for the tone are fed to the electronic control circuit of preamplifier 23 and the control voltages for the other characteristics are supplied to respective electronic control circuits of video processing circuit 14.

Accordingly, when a user turns the power supply ON, tuning voltage forming circuit 41 selects the channel which had been set at a time when the power supply was turned OFF, and control characteristics of sound volume and the like shown in FIG. 7 are set to the respective conditions at such time when the power supply was turned OFF by means of steps [201] to [203]. Then, unless a new adjustment operation is performed, a loop of steps [211] through [214] is repeated to maintain the above conditions.

Next, when switch $S_0$ is pressed, for example, in order to increase the sound volume, step [223] is executed through the process of steps [212]→[221]→[222] and, step [223], the data for the sound volume is incremented by one step by step [321]. This data is written into memory 56 in step [231] and then, the data for all of the control characteristics are transmitted to receiver 100 in step [232]. Accordingly, D-A converter 103 of receiver 100 delivers respective control voltages among which only the sound volume controlling analog voltage is increased by one step with the result that only the sound volume is increased by one step.

In this case, the state of F="1" is maintained by step [222]. Therefore, when switch $S_0$ is continuously pressed, that is, has a continuous pressure applied thereto, steps [212] and [221] are repeated following step [232], and hence, even though switch $S_0$ is continuously pressed, the alteration and transmission of data are carried out only once.

However, when switch $S_0$ is released and then pressed again, the operation is advanced from step [212] through step [213] to step [214] and then returned to step [211] where F="0" is obtained. Therefore, when switch $S_0$ is pressed again, the operation is advanced from step [221] through steps [222], [223] and [231] to [232] and hence, the alteration and transmission of data are once again carried out. Accordingly, each time that switch $S_0$ is pressed, the sound volume increases by one step. Similarly, when any of the other switches $S_1$ to $S_{13}$ is operated, the adjustment is carried out by one step for each operation.

If the mode switch $S_m$ is in the manufacturer's mode, the adjustments in the right-hand column of FIG. 6 can be effected one step at a time, while if the test switch $S_t$ is turned to the quick mode, only one press of any of switches $S_0$ to $S_{13}$ results in the corresponding control characteristic being changed to a maximum or minimum. When switch $S_{14}$ is pressed, step [331] is executed so that the hue, color, picture and brightness are each set to a standard value. Further, when switch $S_{15}$ is pressed, step [341] is executed so that muting of the sound volume is turned ON and OFF whenever switch $S_{15}$ is pressed.

Further, since blanking pulse $P_b$ is successively supplied to shift regiser 101, even when transmitter 50 does not supply data, the data in shift resister 101 is sequentially dropped, and after a lapse of 130 horizontal periods from the vertical blanking interval $t_v$, all of such data will be dropped out. Therefore, before the next vertical blanking interval, shift register 101 will contain no data from transmitter 50. As a result, when a new set of data is fed thereto from transmitter 50, there is no possibility that remaining old data in shift register 101 will cause all of the first four bits and the last four bits of shift register 101 to be at logic level "1" even though such bits are not guide bits or latch bits. In this regard, the latch pulse is not erroneously obtained and no erroneous data is latched into latch circuit 102.

Figure 9:
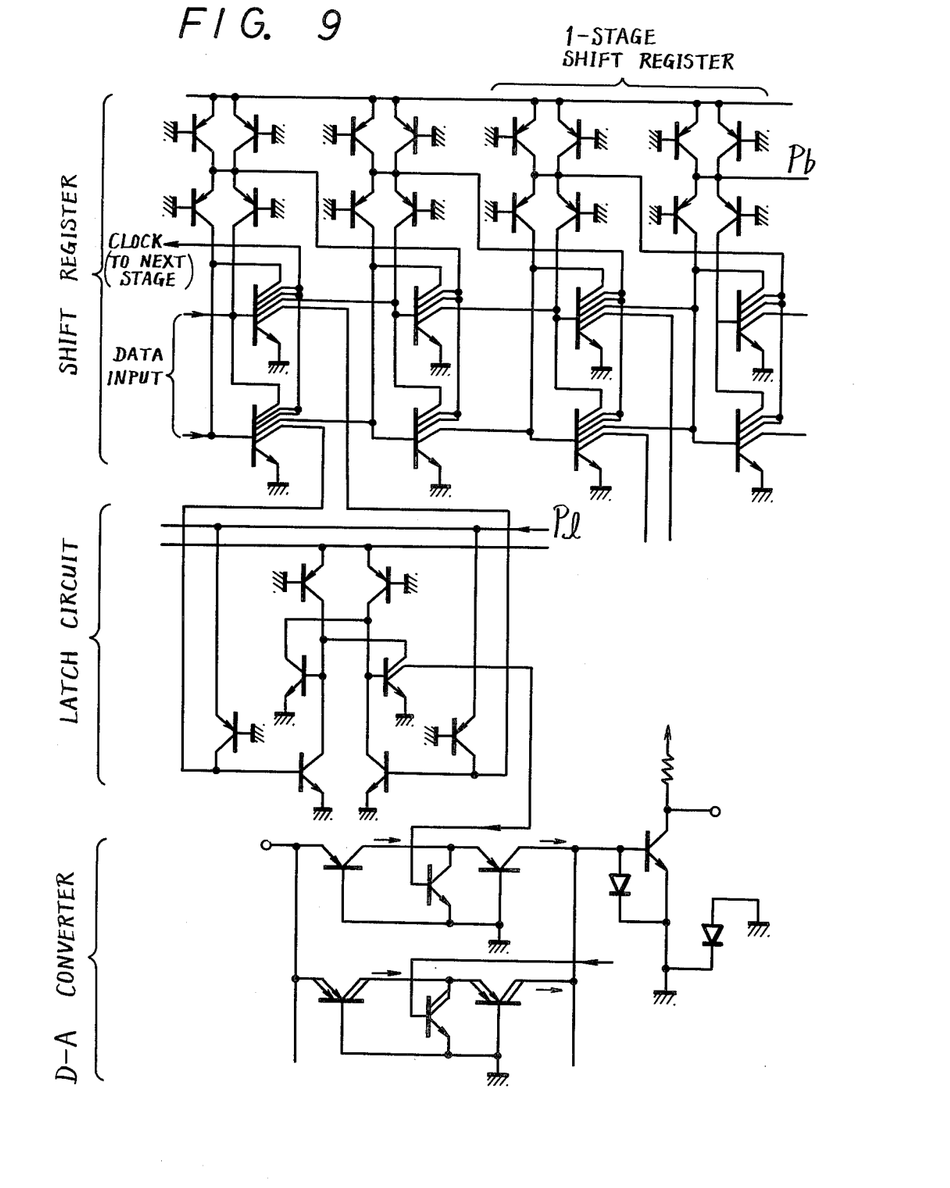
FIG. 9 is a circuit-wiring diagram of a portion of the receiver of FIG. 8.

Referring now to FIG. 9, there is shown a portion of a practical circuit construction of the aforesaid shift register 101, latch circuit 102 and D-A converter 103, in which I²L (intergrated injection logic) is used, and in which the circuit diagram of shift register 101 and latch circuit 102 are for one bit only, this one bit being the LSB of the data for the control characteristic. The D-A coverter utilizes I²L, whereby uniformity of the current amplification factor for each I²L transistor is achieved.

Referring back to FIG. 8, a circuit 105 for compensating for the temperature characteristic of D-A converter 103 and a dummy D-A converter unit 106 for about five bits are provided. The compensating circuit 105 utilizes the fact that an injector current I of the I²L is common to the respective D-A converter units for each control characteristic. The temperature characteristic compensating circuit 105 is connected to the dummy D-A converter unit 106. If the dummy D-A converter unit 106 is stable relative to changes in temperature, the D-A converter units for the respective control characteristics and having substantially the same temperature characteristics as that of the unit 106 are also stable relative to changes in temperature.

When transmitter 50 is defective so that no data is delivered to receiver 100 when the power switch is turned ON, a normal picture will not be projected or reproduced despite normal operating conditions in the television receiver itself. In order to avoid this problem, a break-down recovering circuit 107 for transmitter 50 is connected to latch circuit 102.

Figures 10, 11:
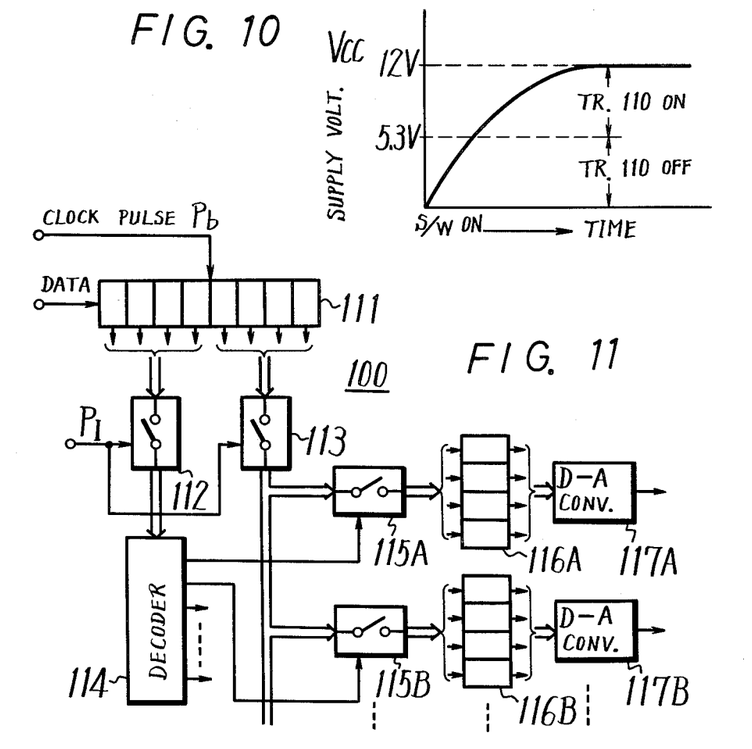
FIG. 10 is a graphical diagram showing the power supply voltage vs. time characteristic curve used for explaining one part of the receiver of FIG. 8, according to this invention.
FIG. 11 is a block diagram of another embodiment of a receiver that can be used in the circuit of FIG. 1.

In break-down recovering circuit 107, a power supply voltage $V_{cc}$ of, for example, 12 volts is divided by resistors 108 and 109 and the divided voltage is applied to the base of a switching transistor 110 for detection. As shown in FIG. 10, the power supply voltage $V_{cc}$ rises up from its switching-on time with a predetermined time constant. However, transistor 110 is designed to be turned OFF when the power supply voltage is, for example, 5.3 V or less, and when transistor 110 is turned OFF, data corresponding to the center value of and adjustable range of the control voltage for each characteristic is preset into latch circuit 102. However, with respect to the sound volume data, the corresponding value is not preset to the center value but rather to the minimum value.

Accordingly, when no data is delivered from transmitter 50 because of a break-down thereof, the data preset into latch circuit 102 by break-down recovering circuit 107 remains fixed to reproduce a picture with the above preset data. In such case, the sound volume is preset to zero. Thus, even though transmitter 50 is defective, an ordinary color picture can be obtained to prevent the above defect from being misunderstood as trouble in another circuit of the television receiver.

When transmitter 50 is not defective, one set of data from non-volatile memory 56 is fed to receiver 100 several times after the power supply voltage has risen up, so that the preset data of latch circuit 102 is rewritten. Thereafter, the control operation is restored to its normal mode, as mentioned previously. The reason for only the sound volume not being set to the center value in the above case is that any noise may not be generated from the speaker upon the switching ON of the power supply.

Thus, the adjustment of respective control characteristics can be performed as mentioned above. In particular, according to this invention, since the data of the resepective control characteristics are serially transferred for adjustment, video processing circuit 14, as well as receiver 100, can be easily formed as an IC by adding thereto only one pin for the supply of data so that the effect of this invention is quite important.

Further, the data is formed by switches $S_0$ to $S_{15}$, so the the reliability is high, as compared with variable resistors, and the cost is low. In addition, switches $S_0$ to $S_{15}$ can be made compact so that the designing tolerance of a television receiver can be widely improved. In this invention, data can be formed by remote control or by manual control. If the adjustment operation is performed at a factory or by a serviceman, with the mode switch $S_m$ being set to the manufacturer's mode, the adjustment operation can be performed while looking at a picture screen by using switches $S_0$ to $S_{15}$, which are provided on the front panel of the television receiver for ease of operation by a user. Thus, the adjustment at the factory is quite easy.

Further, in this invention, since the operation of only switch $S_{14}$ results in the color, hue, brightness and picture being set to a standard condition even though the adjusting conditions are entirely irregular or confused, the operation of this one switch provides for the easy return of the control characteristics to their properly adjustable conditions. Accordingly, it is not necessary to operate all of the respective control switches in order to return the respective control characteristics to their properly adjustable conditions.

In addition, receiver 100 can also be formed as shown in FIG. 11.

In this embodiment, the transmitting data for each control characteristic is added with an ID (identifying) data for identifying the above characteristic. For example, in the embodiment of FIG. 11, data for one control characteristic is formed of eight bits, and the transmitting data is delivered serially from its LSB, in sequence. In this case, the upper four bits thereof are ID data and the lower four bits thereof are control voltage data.

The transmitting data is then supplied to a shift register 111, which is also fed with, for example, the blanking pulse $P_b$ as a clock pulse thereof, as in the aforementioned embodiment. The transmitter 50 also produces a pulse $P_I$ for indicating the junction between data for adjacent control characteristics each time that serial data having eight bits per object is fed to receiver 100. This pulse $P_I$ is transmitted to receiver 100 and is used to turn ON switch circuits (gate circuits) 112 and 113 whereby ID data for the control characteristic is supplied through switch circuit 112 to a decoder 114. In decoder 114, the ID data is decoded so that from switch circuits 115A, 115B ··· which are provided for the respective control characteristics A, B ···, the switch circuit for a selected characteristic is turned ON. In this manner, the control voltage data from shift register 111 is fed through switch circuit 113 and further through one of switch circuits 115A, 115B ···, which is turned ON by the above decoded output, to a corresponding one of temporary memory circuits 116A, 116B ··· provided for the respective control characteristics. Thus, the control voltage data is temporally stored in the corresponding temporary memory circuit, the output of which is applied to a corresponding one of D-A converters 117A, 117B ··· provided for the respective control characteristics where it is then converted into an analog voltage. This analog voltage is supplied to an electronic control circuit for adjusting the respective control characteristic.

Figure 12:
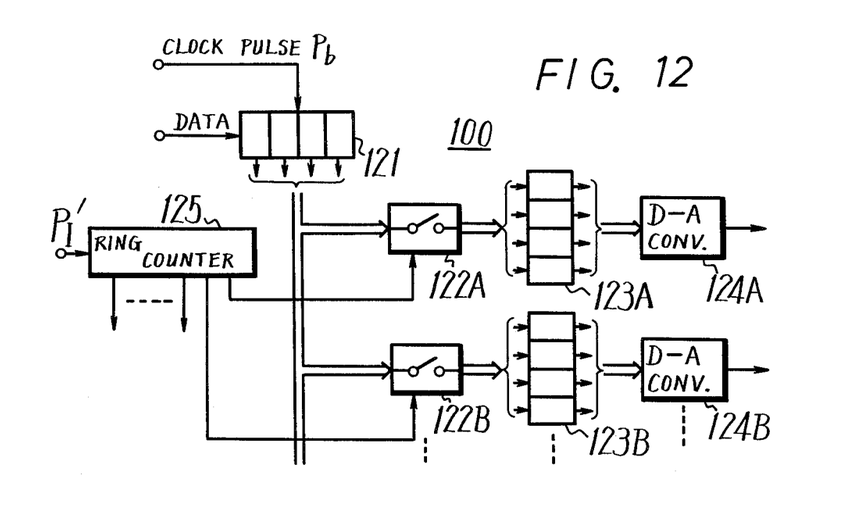
FIG. 12 is a block diagram of another embodiment of a receiver that can be used in the circuit of FIG. 1.

Referring now to FIG. 12, there is shown another embodiment of receiver 100 of this invention. In this embodiment, the transmitting data does not include the ID data for the control characteristic, and the control voltage data is serially transmitted in the order of occurrence of the respective control characteristics. Another pulse P/' for indicating the junctions of the control characteristics is supplied from transmitter 50 to receiver 100.

Similarly, in this embodiment, receiver 100 is provided with switch circuits 122A, 122B ···, temporary memory circuits 123A, 123B ··· for the respective control characteristics, and D-A converters 124A, 124B ···, and parallel data for the respective control characteristics is fed thereto from a shift register 121. In this embodiment, the data is cyclically transmitted in the order of occurrence of the control characteristics. Therefore, pulse P/' is supplied to a ring counter 125 which produces a count corresponding to the number of control characteristics, and the outputs of ring counter 125 are fed to the respective switch circuits 122A, 122B ··· as a control signal for each switch circuit. As a result, a switch circuit corresponding to the transmitted control characteristic is turned ON when data for the above characteristic is stored in shift register 121.

Further, for the sound volume adjustment, it is preferable that the control voltage be gradually changed for a small control amount, but changed rapidly for a large control amount, which changes correspond to a so-called D-curve for variable resistors, rather than a linear change of control voltage for a step variation. One embodiment of a D-A converter, in view of the above, will now be described in relation to FIG. 13.

Figures 13, 14:
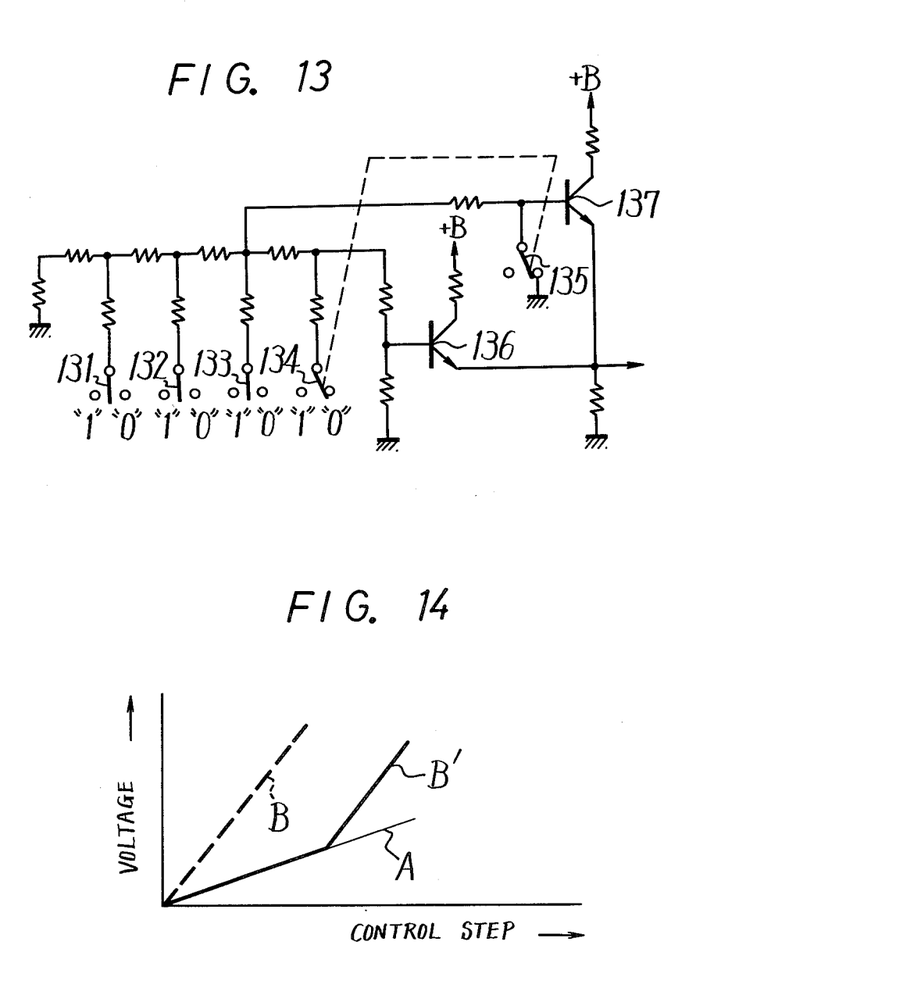
FIG. 13 is a circuit-wiring diagram of one embodiment of a D-A converter that can be used in receiver of FIG. 12.
FIG. 14 is a graphical diagram showing a voltage vs. control step characteristic used for explaining the operation of the D-A converter of FIG. 13

In FIG. 13, switch circuits 131 to 134 are provided, corresponding to 4-bit data, in which switch circuit 131 is controlled by the condition of the LSB and switch circuit 134 is controlled by the condition of the MSB (most significant bit). A switch circuit 135 is associated with switch circuit 134 for the MSB.

In this embodiment, when a transistor 136 is turned ON and a transistor 137 is turned OFF, the control voltage is changed, as shown in FIG. 14, from a straight line A characteristic which is in response to a step variation. If transistors 136 and 137 are both turned ON, the output current of the D-A converter becomes large so that the control voltage is changed as shown in FIG. 14 by the broken line B.

In this embodiment, while the MSB is maintained in a logic level "0" state, switch circuit 135 is changed over to the illustrated state so that transistor 137 becomes nonconductive. When the MSB is at logic level "1" to change over switch circuit 134 to the illustrated position "1", switch circuit 135 which is linked with switch circuit 134 is changed over to a state which is the reverse of the illustrated condition so that transistor 137 is turned ON.

With the above arrangement, for a step variation of the lower three bits only, the analog voltage is gradually changed along the straight line A, and for a step variation added with the MSB, the analog voltage is more quickly changed along a line B' (FIG. 14) which is parallel with broken line B. Consequently, a variation which is an approximate of the D-curve, as shown in FIG. 14 by the bold line therein, is obtained as the complete characteristic curve.

As described above, according to the control apparatus of this invention, the following effects or advantages can be attained:

(i) A plurality of controls can be effected by a single transmission line.

(ii) The circuit is particularly suited to be fabricated as an integrated circuit.
(iii) There is no need to use a plurality of variable resistors.
(iV) User control, as well as manufacturer control, can be carried out by using common switches.
(V) The apparatus to be controlled can be simply preset to a standard condition, if necessary.

Having described specific preferred embodiments of the invention with reference to the accompanying drawings, it is to be understood that the invention is not limited to those precise embodiments, and that various changes and modifications may be effected therein by one skilled in the art without departures from the scope or spirit of the invention as defined in the appended claims.

We claim as our invention:

1. A control apparatus for controlling a plurality of functions, comprising:
   first storage means for storing a plurality of control data entries;
   a plurality of control switch means;
   control data changing means for changing each control data entry in said first storage means in response to the status of said plurality of control switch means;
   test switch means for varying the amount of change of each control data entry by said control data changing means;
   control data transmitting means for serially transmitting control signals corresponding to said plurality of control data entries in said first storage means;
   second storage means;
   control data receiving means for receiving said serially-transmitted control signals and storing said received control signals in said second storage means;
   a plurality of digital-to-analog converting means for generating a plurality of analog control voltages corresponding to said plurality of control data entries, in response to said control signals stored in said second storage means; and
   a plurality of voltage-controlled means for controlling said plurality of functions in response to said plurality of analog control voltages from said plurality of digital-to-analog converting means, respectively.

2. A control apparatus for controlling a plurality of functions, comprising:
   first storage means for storing a plurality of control data entries;
   a plurality of control switch means;
   control data changing means for changing each control data entry in said first storage means in response to the status of said plurality of control switch means;
   mode switch means for controlling said control data changing means to vary the functions to be controlled;
   control data transmitting means for serially transmitting control signals corresponding to said plurality of control data entries in said first storage means;
   second storage means;
   control data receiving means for receiving said serially-transmitted control signals and storing said received control signals in said second storage means;
   a plurality of digital-to-analog converting means for generating a plurality of analog control voltages corresponding to said plurality of control data entries, in response to said control signals stored in said second storage means; and a plurality of voltage-controlled menas for controlling said plurality of functions in response to said plurality of analog control voltages from said plurality of digital-to-analog converting means, respectively.

3. A control apparatus for controlling a plurality of functions, comprising:

first storage means for storing a plurality of control data entries;

a plurality of control switch means;

control data changing means for changing each control data entry in said first storage means in response to the status of said plurality of control switch means;

control data transmitting means for serially transmitting control signals corresponding to said plurality of control data entries in said first storage means, and wherein signals corresponding to at least one of a guide and latch data entry are added to said serially-transmitted control signals;

second storage means including a plurality of latch circuits;

control data receiving means for receiving said serially-transmitted control signals and storing said received control signals in said second storage means, said control data receiving means including a shift register for receiving said serially-transmitted control signals;

gate means for transferring said control signals from said shift register to said plurality of latch circuits only when said signals corresponding to at least one of said guide and latch data entry are at a predetermined state;

a plurality of digital-to-analog converting means for generating a plurality of analog control voltages corresponding to said plurality of control data entries, in response to said control signals stored in said second storage means; and a plurality of voltage-controlled means for controlling said plurality of functions in response to said plurality of analog control voltages from said plurality of digital-to-analog converting means, respectively.

4. A control apparatus for controlling a plurality of functions, comprising:

first storage means for storing a plurality of control data entries;

a plurality of control switch means including preset switch means;

control data changing means for changing each control data entry in said first storage means in response to the status of said plurality of control switch means and for presetting said plurality of control data entries to predetermined values when said preset switch means is actuated;

control data transmitting means for serially transmitting control signals corresponding to said plurality of control data entries in said first storage means;

second storage means;

control data receiving means for receiving said serially-transmitted control signals and storing said received control signals in said second storage means;

a plurality of digital-to-analog converting means for generating a plurality of analog control voltages corresponding to said plurality of control data entries, in response to said control signals stored in said second storage means; and a plurality of voltage-controlled means for controlling said plurality of functions in response to said plurality of analog control voltages from said plurality of digital-to-analog converting means, respectively.

5. A control apparatus for controlling a plurality of functions, comprising:

first storage means for storing a plurality of control data entries;

a plurality of control switch means;

a control data changing means for changing each control data entry in said first storage means in response to the status of a plurality of control switch means;

control data transmitting means for serially transmitting control signals corresponding to said plurality of control data entries in said first storage means, and wherein signals corresponding to at least one of a guide and latch data entry are added to said serially-transmitted control signals;

second storage means;

control data receiving means for receiving said serially-transmitted control signals and storing said received control signals in said second storage means;

gate means for transferring said control signals from said contol data receiving means to said second storage means only when said signals corresponding to at least one of said guide and latch data entry are at a predetermined state;

a plurality of digital-to-analog converting means for generating a plurality of analog control voltages corresponding to said plurality of control data entries, in response to said control signals stored in said second storage means; and a plurality of voltage-controlled means for controlling said plurality of functions in response to said plurality of analog control voltages from said plurality of digital-to-analog converting means, respectively.

6. A control apparatus according to claim 5; wherein said plurality of functions to be controlled correspond to a plurality of characteristics of a reproduced video picture.

7. A control apparatus according to claim 6; wherein said plurality of characteristics include sound volume, hue, color, picture, tone, brightness, and sharpness.

8. A control apparatus according to claim 5; wherein said first storage means includes a non-volatile memory and said control data changing means includes central processing means for changing the data stored at respective entries in said non-volatile memory in response to actuation of selected ones of said control switch means.

* * * * *